United States Patent
Yoon et al.

(10) Patent No.: US 8,691,334 B2
(45) Date of Patent: Apr. 8, 2014

(54) METHOD OF FABRICATING SUBSTRATE WHERE PATTERNS ARE FORMED

(75) Inventors: Euijoon Yoon, Seoul (KR); Sung-Hoon Kwon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 177 days.

(21) Appl. No.: 13/265,348

(22) PCT Filed: Apr. 24, 2009

(86) PCT No.: PCT/KR2009/002154
§ 371 (c)(1),
(2), (4) Date: Oct. 20, 2011

(87) PCT Pub. No.: WO2010/123165
PCT Pub. Date: Oct. 28, 2010

(65) Prior Publication Data
US 2012/0040092 A1    Feb. 16, 2012

(51) Int. Cl.
*B05D 1/12*    (2006.01)
*B05D 1/36*    (2006.01)
*B05D 5/06*    (2006.01)

(52) U.S. Cl.
USPC ............ 427/197; 427/71; 427/199; 427/202; 427/205

(58) Field of Classification Search
USPC ........................ 427/71, 197, 199, 202, 205
See application file for complete search history.

(56) References Cited

U.S. PATENT DOCUMENTS

2005/0082546 A1    4/2005    Lee et al.
2007/0166862 A1    7/2007    Kim et al.
2009/0001398 A1    1/2009    Song et al.

OTHER PUBLICATIONS

Joe Tien et al., "Microfabrication through Electrostatic Self-Assembly," Langmuir, Jul. 29, 1997, pp. 5349-5355, vol. 13, No. 20, American Chemical Society, Washington D.C., USA.
Ali Khademhosseini et al., "Cell docking inside microwells within reversibly sealed microfuidic channels for fabricating multiphenotype cell arrays," The Royal Society of Chemistry, Oct. 13, 2005, pp. 1380-1386, vol. 5.

*Primary Examiner* — Frederick Parker
(74) *Attorney, Agent, or Firm* — William Park & Associates Patent Ltd.

(57) ABSTRACT

Provided is a method of fabricating a substrate where patterns are formed, the method including: forming first bonding agent patterns having selective cohesion in a position in which oxide bead patterns are to be formed on a substrate; coating a second bonding agent having larger cohesion with the first bonding agent than cohesion with the substrate, on a plurality of oxide beads, applying the oxide beads, on which the second bonding agent is coated, to the substrate and forming the oxide beads, on which the second bonding agent is coated, on the first bonding agent patterns; and thermally processing the substrate.

16 Claims, 3 Drawing Sheets

METHOD OF FABRICATING SUBSTRATE WHERE PATTERNS ARE FORMED

TECHNICAL FIELD

The present invention relates to a substrate for a semiconductor device and a method of fabricating the same, and more particularly, to a substrate where a plurality of patterns are formed so as to be used to fabricate a high-output light emitting diode (LED), and a method of fabricating the same.

BACKGROUND ART

Light emitting diode (LED) markets have grown based on low-output LEDs used in a portable communication device such as a mobile phone, a keypad of a small-sized home appliance, or a backlight unit of a liquid crystal display (LCD). Recently, the need for high-output and high-efficiency light sources that are used in interior lighting, external lighting, internal and external spaces of a vehicle, and a backlight unit of a large-sized LCD increases, and LED markets have targeted in high-output products.

The biggest problem in LEDs is low light emitting efficiency. In general, light emitting efficiency is determined by efficiency of generating light (internal quantum efficiency), efficiency in which light is emitted to an external space of a device (external light extracting efficiency), and efficiency in which light is converted by phosphor. It is important to improve a characteristic of an active layer in view of internal quantum efficiency so as to produce high-output LEDs. However, it is very important to increase external light extracting efficiency of light that is actually generated.

The biggest hindrance that occurs when light is emitted to an external space of an LED is internal total reflection caused by a difference in refractive indexes between layers of the LED. Due to the difference in refractive indexes between the layers of the LED, about 20% of light generated is emitted to an external space of an interface between the layers of the LED. Furthermore, light that is not emitted to the external space of the interface between the layers of the LED moves within the LED and is changed into heat. As a result, light emitting efficiency is low, and the amount of heat generated in a device is increased, and the life span of the LED is reduced.

In order to improve external light extracting efficiency, a method of increasing the roughness of a p-GaN surface or an n-GaN surface, a method of making the surface of a substrate as a bottom part of the device rough or a method of forming curved patterns has been suggested.

FIG. 1 is a cross-sectional view of an LED 14 formed on a substrate 10 in which patterns 12 are formed, and FIG. 2 is a view of the substrate 10 in which the patterns 12 are formed. In particular, when the patterns 12 are formed on the substrate 10 of the LED 14 using a different substrate such as a sapphire substrate, external light extracting efficiency is improved.

Patterns formed on the surface of a sapphire substrate are calculated to increase external light extracting efficiency by 100% or more. Korean Patent Application No. 2004-0021801 and No. 2004-0049329 disclose shapes of patterns formed on the surface of the sapphire substrate or the patterns. A method of forming the patterns by using etching has been currently used. In the method of forming the patterns by using etching, in order to form semispherical patterns on a sapphire substrate, a thick layer resist having a thickness of several tens of micrometers is patterned, and then the resist and the sapphire substrate are simultaneously etched by dry etching.

In the method of forming the patterns by using etching, the height of the patterns is limited by an etching selectivity between the resist and the substrate, and due to low uniformity of a process of patterning the thick layer resist and a dry etching process, uniformity of patterns that are finally formed is low. First of all, contamination that occurs in dry etching is the biggest problem. Due to heat that is locally generated during etching, a reactant of the resist and gas that is used in etching remains on the surface of the sapphire substrate and is not completely removed even though a cleaning process is performed. In addition, damages may occur in the surface of the substrate due to high energy gas particles used in etching (Silicon processing for the VLSI ear, vol. 1, process technology, p. 574-582). When such contamination occurs, if GaN epitaxial growth as the next process is performed, defects may occur in a nitride epitaxial layer due to contamination. Due to the above disadvantage, when a device is fabricated by using the sapphire substrate that is patterned by using an etching process, a very low yield is expected.

In the above-mentioned dry etching process, in order to emit an excessive amount of heat generated when sapphire is forcibly etched, a high-priced etching equipment having a cooling function should be used. In order to improve light extracting efficiency, a process of reducing the size of patterns etched using a high-priced photographing equipment such as a stepper should be performed. Thus, costs increase when the above-mentioned dry etching process is performed. In addition, in the process in which the photographing equipment such as the stepper is used, process throughput is not easily increased due to a complicated process.

DISCLOSURE

Technical Problem

The present invention provides a method of fabricating a substrate where patterns are formed, by which, when a substrate is patterned by using an etching process, damages do not occur in a crystal of a substrate or a device characteristic is not degraded due to remnants and the uniformity of the patterns can be greatly increased.

Technical Solution

According to an aspect of the present invention, there is provided a method of fabricating a substrate where patterns are formed, the method including: forming first bonding agent patterns having selective cohesion in a position in which oxide bead patterns are to be formed on a substrate; coating a second bonding agent having larger cohesion with the first bonding agent than cohesion with the substrate, on a plurality of oxide beads; applying the oxide beads, on which the second bonding agent is coated, to the substrate and forming the oxide beads, on which the second bonding agent is coated, on the first bonding agent patterns; and thermally processing the substrate.

According to another aspect of the present invention, there is provided a method of fabricating a substrate where patterns are formed, the method including: forming first bonding agent patterns having selective cohesion in an area from which a position in which oxide bead patterns are to be formed on a substrate is excluded; coating a second bonding agent having smaller cohesion with the first bonding agent than cohesion with the substrate, on a plurality of oxide beads; applying the oxide beads, on which the second bonding agent is coated, to the substrate and forming the oxide beads, on which the second bonding agent is coated, in an area in which the surface of the substrate is exposed; and thermally processing the substrate.

Advantageous Effects

In the method of fabricating the substrate according to the present invention, a plurality of low-priced oxide beads can be patterned on a substrate to have a desired shape so that damages can be prevented from occurring in the substrate during dry etching, and an etching process is not performed so that a yield of a device is not reduced and mass production of the device increases. In addition, a high-priced equipment for dry etching is not needed so that the method of fabricating the substrate is economical and high productivity in which large quantities of substrates are fabricated within a short time is achieved.

MODE FOR INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

The present invention provides a method of fabricating a substrate so as to fabricate a semiconductor device, by which oxide bead patterns are formed on the substrate by using selective cohesion.

Figure 1:
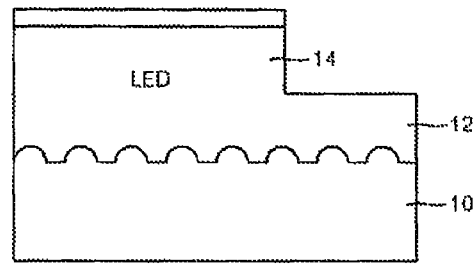
FIG. 1 is a cross-sectional view of a light emitting diode (LED) formed on a substrate in which patterns are formed.
Figure 2:
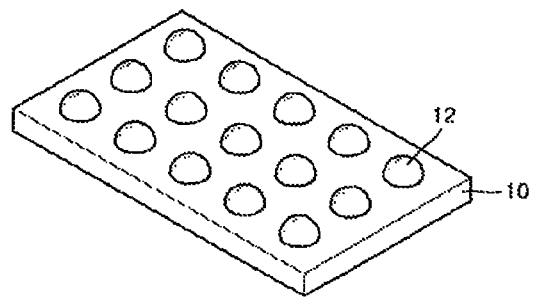
FIG. 2 is a view of the substrate in which the patterns are formed.
Figure 3:
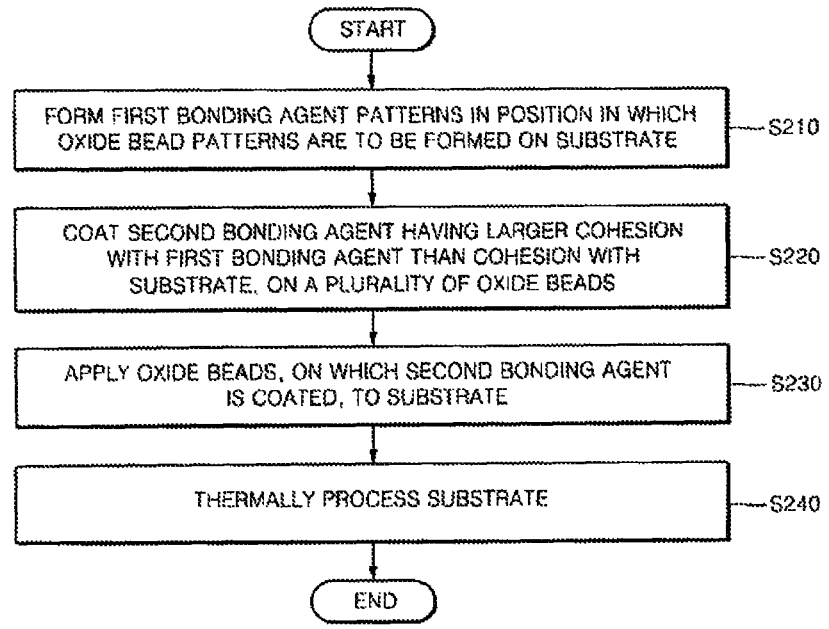
FIG. 3 is a flowchart illustrating a method of fabricating a substrate where patterns are formed by using selective cohesion, according to an embodiment of the present invention.
Figure 4:
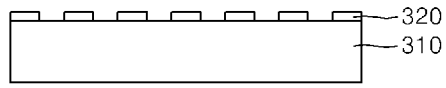
FIGS. 4 through 6 are cross-sectional views of the method of fabricating a substrate in which patterns are formed, shown in FIG. 3.
Figure 5:
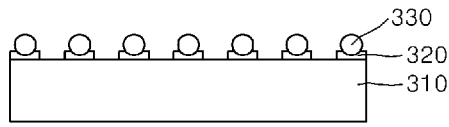
Figure 6:
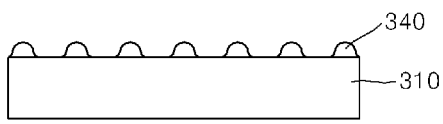

FIG. 3 is a flowchart illustrating a method of fabricating a substrate where patterns are formed by using selective cohesion, according to an embodiment of the present invention, and FIGS. 4 through 6 are cross-sectional views of the method of fabricating a substrate in which patterns are formed, shown in FIG. 3.

Referring to FIGS. 3 through 6, first, as illustrated in FIG. 4, first bonding agent patterns 320 having selective cohesion are formed in a position where oxide bead patterns 340 are to be formed on a substrate 310 (S210). The substrate 310 may be formed of one of sapphire, lithium aluminum oxide (LiAlO$_2$), and magnesium oxide (MgO). The refractive index of each of a plurality of oxide beads 330 is 1.2 to 2.0, and each of the oxide beads 330 is formed of at least one selected from the group consisting of SiO$_2$, Al$_2$O$_3$, TiO$_2$, ZrO$_2$, Y$_2$O$_3$—ZrO$_2$, CuO, Cu$_2$O, Ta$_2$O$_5$, PZT(Pb(Zr,Ti)O$_3$), Nb$_2$O$_5$, Fe$_3$O$_4$, Fe$_2$O$_3$, and GeO$_2$. The oxide beads 330 may be spherical, and the diameter of each of the oxide beads 330 is 0.1 to 10 μm.

The density and size of each of the first bonding agent patterns 320 may be adjusted to values in which light output is maximized, by using simulation. A method of forming the first bonding agent patterns 320 may be performed by using a photolithography process or nano-imprint process.

A method of forming the first bonding agent patterns 320 is performed by using the photolithography process as below. First, a first bonding agent and a resist layer are formed on the substrate 310. Then, the first bonding agent and the resist layer are exposed and developed by using a photomask in which information about the oxide bead patterns 340 to be formed is stored. Last, the first bonding agent patterns 320 are formed by an etching process.

A method of forming the first bonding agent patterns 320 is performed by using the nano-imprint process as below. After a nano-imprint mask is fabricated in a position in which the oxide bead patterns 340 are to be formed, a first bonding agent is applied to the nano-imprint mask. The nano-imprint mask to which the first bonding agent is applied is printed on the substrate 310, thereby forming the first bonding agent patterns 320.

Next, a second bonding agent having larger cohesion with the first bonding agent than cohesion with the substrate 310 is coated on the oxide beads 330 (S220). The oxide beads 330, on which the second bonding agent is coated, are applied to the substrate 310 (S230). The oxide beads 330, on which the second coating agent is coated, may be applied to the substrate 310 by using a method such as a spin coating method. The coating of the second bonding agent having larger cohesion with the first bonding agent than cohesion with the substrate 310 on the oxide beads 330 is to place the oxide beads 330 only on the first bonding agent patterns 320, as illustrated in FIG. 5. In this case, in order to make a difference in cohesion larger, the smaller cohesion between the second bonding agent and the substrate 310 may be, and the larger cohesion between the second bonding agent and the first bonding agent may be. When the second bonding agent having selective cohesion is coated on the oxide beads 330, the oxide beads 330 applied to a portion in which the surface of the substrate 310 is exposed, are easily detached from the first bonding agent patterns 320 due to a difference in cohesion. The oxide beads 330 applied to a portion in which the first bonding agent patterns 320 are formed, are not detached from the first bonding agent patterns 320 due to cohesion between the second bonding agent coated on the oxide bead 330 and the first bonding agent, and remain on the first bonding agent patterns 320.

When the oxide beads 330, on which the second bonding agent is coated, are cohered to a side surface of the first bonding agent patterns 320, the oxide beads 330 are formed in a portion in which the surface of the substrate 310 is exposed, i.e., in a undesired portion. Thus, the oxide beads 330 must be prevented from being cohered to the side surface of the first bonding agent patterns 320. Thus, the height of the first bonding agent patterns 320 from the substrate 310 may be smaller than a radius of each of the spherical oxide beads 330 so that the side surface of the first bonding agent patterns 320 and each of the oxide beads 330 are not cohered to each other. In order to make the height of the first bonding agent patterns 320 from the substrate 310 smaller than the radius of each of the spherical oxide beads 330, possibility that the oxide beads 330 may be cohered to the side surface of the first bonding agent patterns 320, is reduced.

The substrate 310 is thermally processed, thereby cohering the oxide beads 330 to the substrate 310 (S240). The substrate 310 is thermally processed between 500° C. and 1400° C., and may be thermally processed between 800° C. and 1200°

C. If the substrate 310 is thermally processed in this way, the first bonding agent patterns 320 formed on the substrate 310 and the second bonding agent coated on the oxide beads 330 are removed. Thus, as illustrated in FIG. 6, the oxide beads 330 are cohered to the substrate 310, thereby fabricating the substrate 310 in which the patterned oxide beads 340 are formed.

If the substrate 310 is fabricated by using the method shown in FIG. 3, the substrate 310 having good light extracting efficiency can be fabricated.

Figure 7:
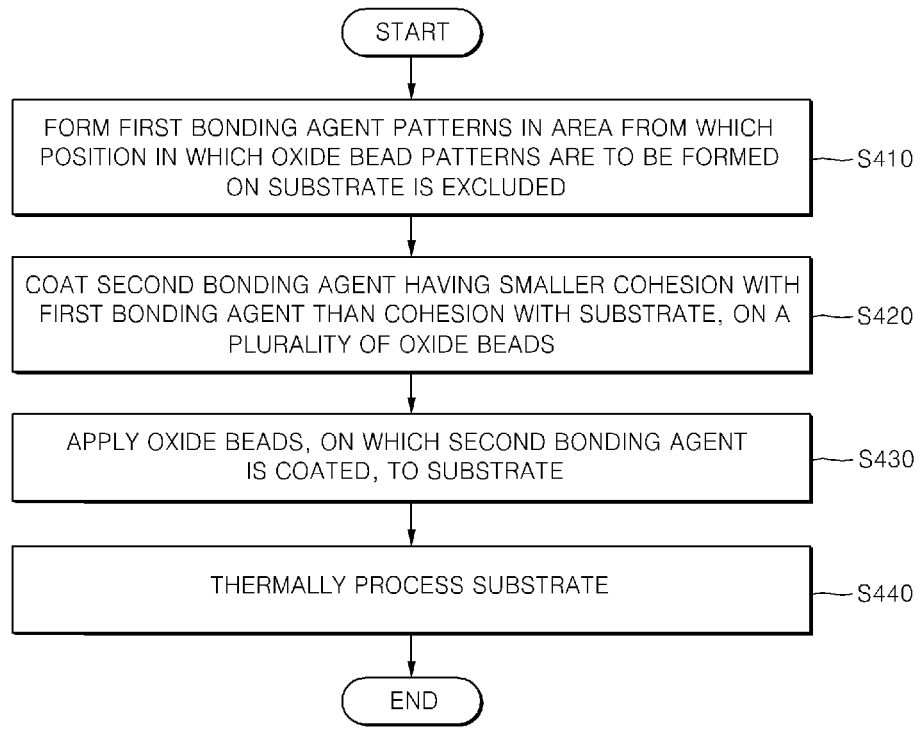
FIG. 7 is a flowchart illustrating a method of fabricating a substrate where patterns are formed by using selective cohesion, according to another embodiment of the present invention.
Figure 8:
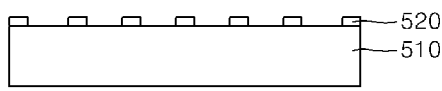
FIGS. 8 through 10 are cross-sectional views of the method of fabricating a substrate in which patterns are formed, shown in FIG. 7.
Figure 9:
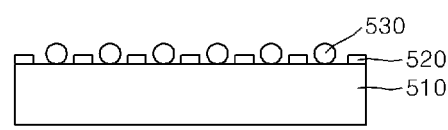
Figure 10:
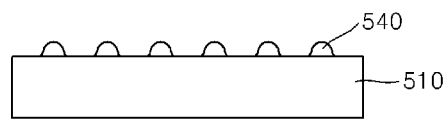

FIG. 7 is a flowchart illustrating a method of fabricating a substrate where patterns are formed by using selective cohesion, according to another embodiment of the present invention, and FIGS. 8 through 10 are cross-sectional views of the method of fabricating a substrate in which patterns are formed, shown in FIG. 7. Contrary to the method of fabricating the substrate of FIG. 3, FIG. 7 illustrates a method of fabricating a substrate by which a second bonding agent having large cohesion with the substrate and small cohesion with a first bonding agent is coated on a plurality of oxide beads, the oxide beads are applied between first bonding agent patterns and the patterned oxide beads are formed.

Referring to FIGS. 7 through 10, first, first bonding agent patterns 520 are formed in an area from which a position in which oxide bead patterns 540 are to be formed on a substrate 510 is excluded (S410). Like in the method of fabricating the substrate shown in FIG. 3, the substrate 510 may be formed of one of sapphire, lithium aluminum oxide ($LiAlO_2$), and magnesium oxide (MgO). The refractive index of each of a plurality of oxide beads 530 is 1.2 to 2.0, and each of the oxide beads 530 is formed of at least one selected from the group consisting of $SiO_2$, $Al_2O_3$, $TiO_2$, $ZrO_2$, $Y_2O_3$—$Zr_2$, CuO, $Cu_2O$, $Ta_2O_5$, PZT(Pb(Zr,Ti)$O_3$), $Nb_2O_5$, $Fe_3O_4$, $Fe_2O_3$, and $GeO_2$. The oxide beads 530 may be spherical, and the diameter of each of the oxide beads 530 is 0.1 to 10 μm. The density and size of each of the first bonding agent patterns 520 may be adjusted to values in which light output is maximized, by using simulation. A method of forming the first bonding agent patterns 520 may be performed by using a photolithography process or nano-imprint process. The photolithography process or nano-imprint process is performed like in the method of fabricating the substrate shown in FIG. 3.

Next, a second bonding agent having smaller cohesion with the first bonding agent than cohesion with the substrate 510 is coated on the oxide beads 530 (S420). The oxide beads 530, on which the second bonding agent is coated, are applied to the substrate 510 (S430). If the second bonding agent having smaller cohesion with the first bonding agent than cohesion with the substrate 510 is coated on the oxide bead 530 and is coated on the substrate 510, contrary to the method of fabricating the substrate shown in FIG. 3, the oxide beads 530 applied to the first bonding agent patterns 520 are easily detached from the oxide bead patterns 540. On the other hand, the oxide beads 530 applied to the substrate 510 are not detached from the oxide bead patterns 540, and remain on the substrate 510, as illustrated in FIG. 9.

The substrate 510 is thermally processed, thereby cohering the oxide beads 530 to the substrate 510 (S440). The substrate 510 is thermally processed between 500° C. and 1400° C., and may be thermally processed between 800° C. and 1200° C. If the substrate 310 is thermally processed in this way, the first bonding agent patterns 520 formed on the substrate 510 and the second bonding agent coated on the oxide beads 530 are removed. Thus, as illustrated in FIG. 10, the oxide beads 530 are cohered to the substrate 510, thereby fabricating the substrate 510 in which the patterned oxide beads 540 are formed.

If the substrate 510 is fabricated by using the method shown in FIG. 7, as in the method shown in FIG. 3, the substrate 510 having good light extracting efficiency can be fabricated.

As described above, in the method of fabricating the substrate according to the present invention, a plurality of low-priced oxide beads can be patterned on a substrate to have a desired shape so that damages can be prevented from occurring in the substrate during dry etching, and an etching process is not performed so that a yield of a device is not reduced and mass production of the device increases. In addition, a high-priced equipment for dry etching is not needed so that the method of fabricating the substrate is economical and high productivity in which large quantities of substrates are fabricated within a short time is achieved.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of fabricating a substrate where patterns are formed, the method comprising:
    forming first bonding agent patterns having selective cohesion in a position in which oxide bead patterns are to be formed on a substrate;
    coating a second bonding agent having a second cohesion on a plurality of oxide beads, wherein a cohesion of the second bonding agent with the first bonding agent is greater than the second bonding agent with the substrate;
    applying the oxide beads, on which the second bonding agent is coated, to the substrate, thereby placing the oxide beads on or with the first bonding agent patterns to form a coated substrate; and
    thermally processing the coated substrate to cohere the oxide beads to the substrate.

2. The method of claim 1, wherein the substrate is formed of one of sapphire, lithium aluminum oxide ($LiAlO_2$), and magnesium oxide (MgO).

3. The method of claim 1, wherein a refractive index of each of the oxide beads is 1.2 to 2.0.

4. The method of claim 1, wherein each of the oxide beads is formed of at least one selected from the group consisting of $SiO_2$, $Al_2O_3$, $TiO_2$, $ZrO_2$, $Y_2O_3$—$ZrO_2$, CuO, $Cu_2O$, $Ta_2O_5$, PZT(Pb(Zr,Ti)$O_3$), $Nb_2O_5$, $Fe_3O_4$, $Fe_2O_3$, and $GeO_2$.

5. The method of claim 1, wherein the oxide beads are spherical.

6. The method of claim 5, wherein a diameter of each of the oxide beads is 0.1 to 10 μm.

7. The method of claim 1, wherein the thermally processing of the substrate is performed between 500° C. to 1400° C.

8. The method of claim 1, wherein the forming of the first bonding agent patterns is performed by using one of a photolithography process and nano-imprint process.

9. The method of claim 1, wherein the oxide beads are spherical, and wherein a height of the first bonding agent patterns from the substrate is smaller than a radius of each of the oxide beads.

10. A method of fabricating a substrate where patterns are formed, the method comprising:
    forming first bonding agent patterns having selective cohesion in an area from which a position in which oxide bead patterns are to be formed on a substrate is excluded;
    coating a second bonding agent on a plurality of oxide beads, wherein a cohesion of the second bonding agent with the first bonding agent is smaller than that of the second bonding agent with the substrate;

applying the oxide beads, on which the second bonding agent is coated, to the substrate and thereby placing the oxide beads on or with the second bonding agent, in an area in which the surface of the substrate is exposed to form a coated substrate; and thermally processing the coated substrate to cohere the oxide beads to the substrate.

11. The method of claim 10, wherein the substrate is formed of one of sapphire, lithium aluminum oxide ($LiAlO_2$), and magnesium oxide (MgO).

12. The method of claim 10, wherein a refractive index of each of the oxide beads is 1.2 to 2.0.

13. The method of claim 10, wherein each of the oxide beads is formed of at least one selected from the group consisting of $SiO_2$, $Al_2O_3$, $TiO_2$, $ZrO_2$, $Y_2O_3$—$ZrO_2$, CuO, $Cu_2O$, $Ta_2O_5$, PZT($Pb(Zr,Ti)O_3$), $Nb_2O_5$, $Fe_3O_4$, $Fe_2O_3$, and $GeO_2$.

14. The method of claim 10, wherein the oxide beads are spherical.

15. The method of claim 10, wherein the thermally processing of the substrate is performed between 500° C. to 1400° C.

16. The method of claim 10, wherein the forming of the first bonding agent patterns is performed by using one of a photolithography process and nano-imprint process.

* * * * *

UNITED STATES PATENT AND TRADEMARK OFFICE
CERTIFICATE OF CORRECTION

| | | |
|---|---|---|
| PATENT NO. | : 8,691,334 B2 | Page 1 of 1 |
| APPLICATION NO. | : 13/265348 | |
| DATED | : April 8, 2014 | |
| INVENTOR(S) | : Euijoon Yoon et al. | |

It is certified that error appears in the above-identified patent and that said Letters Patent is hereby corrected as shown below:

TITLE PAGE: ITEM 73

Delete "SK Hynix Inc., Gyeonggi-do (KR)" and insert --SNU R&DB Foundation, Seoul (KR)--

Signed and Sealed this
Eighth Day of March, 2016

Michelle K. Lee
*Director of the United States Patent and Trademark Office*